United States Patent
Cheung et al.

(10) Patent No.: US 8,591,661 B2
(45) Date of Patent: *Nov. 26, 2013

(54) LOW DAMAGE PHOTORESIST STRIP METHOD FOR LOW-K DIELECTRICS

(75) Inventors: David Cheung, Foster City, CA (US); Ted Li, Sunnyvale, CA (US); Anirban Guha, Milpitas, CA (US); Kirk Ostrowski, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 280 days.

This patent is subject to a terminal disclaimer.

(21) Appl. No.: 12/636,601

(22) Filed: Dec. 11, 2009

(65) Prior Publication Data

US 2011/0139176 A1 Jun. 16, 2011

(51) Int. Cl.
*B08B 5/00* (2006.01)
(52) U.S. Cl.
USPC ............... 134/1.2; 216/64; 216/67; 438/689; 438/710; 438/725; 438/96; 134/1; 134/1.1; 134/19; 134/21; 134/26; 134/30; 134/35; 134/36; 134/37; 134/41; 134/42; 134/902
(58) Field of Classification Search
USPC ............. 216/64, 67; 438/689, 710, 725, 906; 134/1, 1.1, 1.2, 19, 21, 26, 30, 35, 36, 134/37, 41, 42, 902
See application file for complete search history.

(56) References Cited

U.S. PATENT DOCUMENTS

| | | |
|---|---|---|
| 4,201,579 A | 5/1980 | Robinson et al. |
| 4,357,203 A | 11/1982 | Zelez |
| 4,699,689 A | 10/1987 | Bersin |
| 5,122,225 A | 6/1992 | Douglas |
| 5,158,644 A | 10/1992 | Cheung et al. |
| 5,292,393 A | 3/1994 | Maydan et al. |
| 5,354,386 A | 10/1994 | Cheung et al. |
| 5,593,541 A | 1/1997 | Wong et al. |
| 5,626,678 A | 5/1997 | Sahin et al. |
| 5,633,073 A | 5/1997 | Cheung et al. |
| 5,660,682 A | 8/1997 | Zhao et al. |
| 5,707,485 A | 1/1998 | Rolfson et al. |
| 5,767,021 A | 6/1998 | Imai et al. |
| 5,792,269 A | 8/1998 | Deacon et al. |

(Continued)

FOREIGN PATENT DOCUMENTS

| | | |
|---|---|---|
| EP | 1 077 476 | 2/2001 |
| EP | 1081754 | 7/2001 |

(Continued)

OTHER PUBLICATIONS

U.S. Office Action for U.S. Appl. No. 12/251,305 mailed Nov. 2, 2011.

(Continued)

*Primary Examiner* — Bibi Carrillo
(74) *Attorney, Agent, or Firm* — Weaver Austin Villeneuve & Sampson LLP (57) ABSTRACT

Improved methods for stripping photoresist and removing etch-related residues from dielectric materials are provided. In one aspect of the invention, methods involve removing material from a dielectric layer using a hydrogen-based etch process employing a weak oxidizing agent and fluorine-containing compound. Substrate temperature is maintained at a level of about 160° C. or less, e.g., less than about 90° C.

15 Claims, 5 Drawing Sheets

(56) References Cited

U.S. PATENT DOCUMENTS

| | | | |
|---|---|---|---|
| 5,811,358 A | 9/1998 | Tseng et al. |
| 5,814,155 A | 9/1998 | Solis et al. |
| 5,817,406 A | 10/1998 | Cheung et al. |
| 5,820,685 A | 10/1998 | Kurihara et al. |
| 5,830,775 A | 11/1998 | Maa et al. |
| 5,844,195 A | 12/1998 | Fairbairn et al. |
| 5,900,351 A | 5/1999 | Lutsic et al. |
| 5,908,672 A | 6/1999 | Ryu et al. |
| 5,911,834 A | 6/1999 | Fairbairn et al. |
| 5,968,324 A | 10/1999 | Cheung et al. |
| 5,980,770 A | 11/1999 | Ramachandran et al. |
| 6,030,901 A | 2/2000 | Hopper et al. |
| 6,039,834 A | 3/2000 | Tanaka et al. |
| 6,045,618 A | 4/2000 | Raoux et al. |
| 6,054,379 A | 4/2000 | Yau et al. |
| 6,072,227 A | 6/2000 | Yau et al. |
| 6,077,764 A | 6/2000 | Sugiarto et al. |
| 6,083,852 A | 7/2000 | Cheung et al. |
| 6,086,952 A | 7/2000 | Lang et al. |
| 6,098,568 A | 8/2000 | Raoux et al. |
| 6,107,184 A | 8/2000 | Mandal et al. |
| 6,125,788 A | 10/2000 | Hills et al. |
| 6,127,262 A | 10/2000 | Huang et al. |
| 6,129,091 A | 10/2000 | Lee et al. |
| 6,130,166 A | 10/2000 | Yeh |
| 6,156,149 A | 12/2000 | Cheung et al. |
| 6,162,323 A | 12/2000 | Koshimizu |
| 6,171,945 B1 | 1/2001 | Mandal et al. |
| 6,184,134 B1 | 2/2001 | Chaudhary et al. |
| 6,187,072 B1 | 2/2001 | Cheung et al. |
| 6,193,802 B1 | 2/2001 | Pang et al. |
| 6,194,628 B1 | 2/2001 | Pang et al. |
| 6,203,657 B1 | 3/2001 | Collison et al. |
| 6,204,192 B1 | 3/2001 | Zhao et al. |
| 6,209,484 B1 | 4/2001 | Huang et al. |
| 6,230,652 B1 | 5/2001 | Tanaka et al. |
| 6,245,690 B1 | 6/2001 | Yau et al. |
| 6,277,733 B1 | 8/2001 | Smith |
| 6,281,135 B1 | 8/2001 | Han et al. |
| 6,287,990 B1 | 9/2001 | Cheung et al. |
| 6,303,523 B2 | 10/2001 | Cheung et al. |
| 6,306,564 B1 | 10/2001 | Mullee |
| 6,319,842 B1 | 11/2001 | Khosla et al. |
| 6,324,439 B1 | 11/2001 | Cheung et al. |
| 6,340,435 B1 | 1/2002 | Bjorkman et al. |
| 6,342,446 B1 | 1/2002 | Smith et al. |
| 6,348,725 B2 | 2/2002 | Cheung et al. |
| 6,350,701 B1 | 2/2002 | Yamazaki |
| 6,358,573 B1 | 3/2002 | Raoux et al. |
| 6,361,707 B1 | 3/2002 | Tanaka et al. |
| 6,365,516 B1 | 4/2002 | Frenkel et al. |
| 6,395,092 B1 | 5/2002 | Sugiarto et al. |
| 6,413,583 B1 | 7/2002 | Moghadam et al. |
| 6,426,304 B1 | 7/2002 | Chien et al. |
| 6,448,187 B2 | 9/2002 | Yau et al. |
| 6,465,964 B1 | 10/2002 | Taguchi et al. |
| 6,511,903 B1 | 1/2003 | Yau et al. |
| 6,511,909 B1 | 1/2003 | Yau et al. |
| 6,517,913 B1 | 2/2003 | Cheung et al. |
| 6,537,422 B2 | 3/2003 | Sakuma et al. |
| 6,537,929 B1 | 3/2003 | Cheung et al. |
| 6,541,282 B1 | 4/2003 | Cheung et al. |
| 6,555,472 B2 | 4/2003 | Aminpur |
| 6,562,544 B1 | 5/2003 | Cheung et al. |
| 6,562,690 B1 | 5/2003 | Cheung et al. |
| 6,569,257 B1 | 5/2003 | Nguyen et al. |
| 6,593,247 B1 | 7/2003 | Huang et al. |
| 6,596,655 B1 | 7/2003 | Cheung et al. |
| 6,632,735 B2 | 10/2003 | Yau et al. |
| 6,638,875 B2 | 10/2003 | Han et al. |
| 6,660,656 B2 | 12/2003 | Cheung et al. |
| 6,660,663 B1 | 12/2003 | Cheung et al. |
| 6,663,715 B1 | 12/2003 | Yuda et al. |
| 6,669,858 B2 | 12/2003 | Bjorkman et al. |
| 6,680,164 B2 | 1/2004 | Nguyen et al. |
| 6,680,420 B2 | 1/2004 | Pang et al. |
| 6,689,930 B1 | 2/2004 | Pang et al. |
| 6,693,043 B1 | 2/2004 | Li et al. |
| 6,709,715 B1 | 3/2004 | Lang et al. |
| 6,720,132 B2 | 4/2004 | Tsai et al. |
| 6,730,593 B2 | 5/2004 | Yau et al. |
| 6,734,115 B2 | 5/2004 | Cheung et al. |
| 6,743,737 B2 | 6/2004 | Yau et al. |
| 6,764,940 B1 | 7/2004 | Rozbicki et al. |
| 6,770,556 B2 | 8/2004 | Yau et al. |
| 6,787,452 B2 | 9/2004 | Sudijono et al. |
| 6,797,188 B1 | 9/2004 | Shen et al. |
| 6,800,571 B2 | 10/2004 | Cheung et al. |
| 6,806,207 B2 | 10/2004 | Huang et al. |
| 6,837,967 B1 | 1/2005 | Berman et al. |
| 6,848,455 B1 | 2/2005 | Shrinivasan et al. |
| 6,858,153 B2 | 2/2005 | Bjorkman et al. |
| 6,869,896 B2 | 3/2005 | Cheung et al. |
| 6,900,135 B2 | 5/2005 | Somekh et al. |
| 6,902,682 B2 | 6/2005 | Shang et al. |
| 6,930,061 B2 | 8/2005 | Cheung et al. |
| 7,023,092 B2 | 4/2006 | Yau et al. |
| 7,070,657 B1 | 7/2006 | Cheung et al. |
| 7,074,298 B2 | 7/2006 | Gondhalekar et al. |
| 7,160,821 B2 | 1/2007 | Huang et al. |
| 7,186,648 B1 | 3/2007 | Rozbicki et al. |
| 7,202,176 B1 | 4/2007 | Goto et al. |
| 7,205,249 B2 | 4/2007 | Cheung et al. |
| 7,227,244 B2 | 6/2007 | Bjorkman et al. |
| 7,256,134 B2 | 8/2007 | Kim et al. |
| 7,288,484 B1 | 10/2007 | Goto et al. |
| 7,297,635 B2 | 11/2007 | Toda et al. |
| 7,344,993 B2 | 3/2008 | Balasubramaniam et al. |
| 7,390,755 B2 | 6/2008 | Chen et al. |
| 7,432,209 B2 | 10/2008 | Delgadino et al. |
| 7,465,680 B2 | 12/2008 | Chen et al. |
| 7,468,326 B2 | 12/2008 | Chen et al. |
| 7,556,712 B2 | 7/2009 | Yi et al. |
| 7,560,377 B2 | 7/2009 | Cheung et al. |
| 7,569,492 B1 | 8/2009 | Chen et al. |
| 7,585,777 B1 | 9/2009 | Goto et al. |
| 7,595,005 B2 | 9/2009 | Balasubramaniam |
| 7,597,816 B2 | 10/2009 | Chang et al. |
| 7,601,272 B2 | 10/2009 | Nguyen et al. |
| 7,628,864 B2 | 12/2009 | Moriya et al. |
| 7,651,949 B2 | 1/2010 | Jo |
| 7,740,768 B1 | 6/2010 | Goto et al. |
| 8,058,178 B1 | 11/2011 | Goto et al. |
| 8,058,181 B1 | 11/2011 | Chen et al. |
| 8,097,527 B2 * | 1/2012 | Yang ........................... 438/478 |
| 8,129,281 B1 | 3/2012 | Cheung et al. |
| 8,193,096 B2 | 6/2012 | Goto et al. |
| 8,435,895 B2 | 5/2013 | Chen et al. |
| 8,444,869 B1 | 5/2013 | Goto et al. |
| 2001/0014529 A1 | 8/2001 | Chen et al. |
| 2002/0000202 A1 | 1/2002 | Yuda et al. |
| 2002/0005392 A1 | 1/2002 | Luo et al. |
| 2002/0045331 A1 | 4/2002 | Aminpur |
| 2002/0072016 A1 | 6/2002 | Chen et al. |
| 2002/0078976 A1 | 6/2002 | Nguyen |
| 2002/0081854 A1 | 6/2002 | Morrow et al. |
| 2002/0090827 A1 | 7/2002 | Yokoshima |
| 2002/0111041 A1 | 8/2002 | Annapragada et al. |
| 2002/0132486 A1 | 9/2002 | Williams et al. |
| 2002/0139775 A1 | 10/2002 | Chang et al. |
| 2002/0185151 A1 | 12/2002 | Qingyuan et al. |
| 2002/0185226 A1 | 12/2002 | Lea et al. |
| 2002/0187643 A1 | 12/2002 | Gu et al. |
| 2002/0197870 A1 | 12/2002 | Johnson |
| 2003/0045115 A1 | 3/2003 | Fang |
| 2003/0045131 A1 | 3/2003 | Verbeke et al. |
| 2004/0084412 A1 | 5/2004 | Waldfried et al. |
| 2004/0245091 A1 | 12/2004 | Karim et al. |
| 2004/0248414 A1 | 12/2004 | Tsai et al. |
| 2005/0079723 A1 | 4/2005 | Niimi et al. |
| 2005/0106888 A1 | 5/2005 | Chiu et al. |
| 2005/0158667 A1 | 7/2005 | Nguyen et al. |
| 2005/0196967 A1 | 9/2005 | Savas et al. |
| 2006/0046482 A1 | 3/2006 | Verhaverbeke |

(56) References Cited

U.S. PATENT DOCUMENTS

| | | | |
|---|---|---|---|
| 2006/0102197 A1 | 5/2006 | Chiang et al. | |
| 2006/0138399 A1 | 6/2006 | Itano et al. | |
| 2006/0154471 A1 | 7/2006 | Minami | |
| 2006/0163202 A1 | 7/2006 | Shimizu et al. | |
| 2006/0191478 A1 | 8/2006 | Gondhalekar et al. | |
| 2006/0201623 A1 | 9/2006 | Yoo | |
| 2006/0289384 A1 | 12/2006 | Pavel et al. | |
| 2007/0040172 A1 | 2/2007 | Kawakami et al. | |
| 2007/0068900 A1 | 3/2007 | Kim et al. | |
| 2007/0144673 A1 | 6/2007 | Yeom | |
| 2007/0179698 A1 | 8/2007 | Oehme | |
| 2007/0224826 A1 | 9/2007 | Delgadino et al. | |
| 2007/0235137 A1 | 10/2007 | Tsukamoto et al. | |
| 2007/0281491 A1 | 12/2007 | Kamp | |
| 2008/0026589 A1 | 1/2008 | Hubacek et al. | |
| 2008/0102646 A1 | 5/2008 | Kawaguchi et al. | |
| 2008/0248656 A1 | 10/2008 | Chen et al. | |
| 2008/0286697 A1 | 11/2008 | Verhaverbeke et al. | |
| 2009/0053901 A1 | 2/2009 | Goto et al. | |
| 2009/0056875 A1 | 3/2009 | Goto et al. | |
| 2009/0061623 A1* | 3/2009 | Chang et al. | 438/664 |
| 2009/0200268 A1 | 8/2009 | Tappan et al. | |
| 2009/0221148 A1 | 9/2009 | Uda et al. | |
| 2009/0277871 A1 | 11/2009 | Berry et al. | |
| 2010/0015812 A1 | 1/2010 | Nishikawa | |
| 2010/0062591 A1 | 3/2010 | Lin et al. | |
| 2011/0006034 A1* | 1/2011 | Hilkene et al. | 216/22 |
| 2011/0139175 A1 | 6/2011 | Cheung et al. | |
| 2011/0139176 A1 | 6/2011 | Cheung et al. | |
| 2011/0143548 A1 | 6/2011 | Cheung et al. | |
| 2012/0211473 A1* | 8/2012 | Goto et al. | 219/121.59 |
| 2013/0048014 A1 | 2/2013 | Shaviv et al. | |

FOREIGN PATENT DOCUMENTS

| | | |
|---|---|---|
| JP | 2007/019367 | 1/2007 |
| JP | 2007-266610 | 10/2007 |
| WO | 2011/071980 | 6/2011 |
| WO | 2011/072042 | 6/2011 |
| WO | 2011/072061 | 6/2011 |
| WO | 2012/018375 | 2/2012 |

OTHER PUBLICATIONS

U.S. Office Action for U.S. Appl. No. 12/786,230 mailed Nov. 10, 2011.
Notice of Allowance for U.S. Appl. No. 11/128,930 mailed Oct. 28, 2011.
Allowed Claims as of Oct. 28, 2011, for U.S. Appl. No. 11/128,930.
Chen, et al., "Methods for Stripping Photoresist and/or Cleaning Metal Regions," U.S. Appl. No. 11/696,633, filed Apr. 7, 2007.
Office Action mailed Dec. 15, 2009, for U.S. Appl. No. 11/696,633.
Office Action mailed May 26, 2010, for U.S. Appl. No. 11/696,633.
Final Office Action mailed Sep. 20, 2010, for U.S. Appl. No. 11/696,633.
Office Action mailed Jun. 6, 2011, for U.S. Appl. No. 11/696,633.
Final Office Action mailed Sep. 28, 2011, for U.S. Appl. No. 11/696,633.
Office Action mailed Jan. 27, 2012, for U.S. Appl. No. 11/696,633.
Notice of Allowance for U.S. Appl. No. 12/251,305 mailed Feb. 17, 2012.
Allowed Claims as of Feb. 17, 2012 for U.S. Appl. No. 12/251,305.
U.S. Final Office Action for U.S. Appl. No. 12/786,230 mailed Apr. 26, 2012.
Singapore Written Opinion and Search Report mailed Feb. 2, 2012, for Application No. 201104086-2.
Goto, et al., "High Dose Implantation Strip (HDIS) in H2 Base Chemistry," Novellus Systems, Inc., U.S. Appl. No. 13/462,660, filed May 2, 2012.
Final Office Action mailed May 15, 2012, for U.S. Appl. No. 11/696,633.
U.S. Appl. No. 12/786,230, filed May 24, 2010, entitled "Simultaneous Front Side Ash and Backside Clean".
U.S. Appl. No. 13/274,638, filed Oct. 17, 2011, entitled "Photoresist Strip Method for Low-K Dielectrics.".
U.S. Appl. No. 13/370,689, filed Feb. 10, 2012, entitled "Plasma Based Photoresist Removal System for Cleaning Post Ash Residue".
U.S. Appl. No. 13/590,083, filed Aug. 20, 2012, entitled "Photoresist Strip Processes for Improved Device Integrity".
US Office Action, dated Sep. 6, 2012, issued in U.S. Appl. No. 12/636,582.
US Office Action, dated Jul. 27, 2012, issued in U.S. Appl. No. 12/963,503.
Notice of Allowance, dated Oct. 29, 2012, issued in U.S. Appl. No. 11/696,633.
Singapore Second Written Opinion, dated Aug. 7, 2012, issued in Application No. 201104086-2.
Chinese Office Action mailed Jul. 20, 2012, issued in Application No. 200810187894.4.
U.S. Appl. No. 13/759,958, filed Feb. 5, 2013, entitled "Methods for Stripping Photoresist and/or Cleaning Metal Regions." .
US Office Action, dated Apr. 26, 2013, issued in U.S. Appl. No. 13/462,660.
US Final Office Action, dated May 13, 2013, issued in U.S. Appl. No. 12/636,582.
US Final Office Action, dated Jan. 22, 2013, issued in U.S. Appl. No. 12/963,503.
Notice of Allowance dated Jan. 24, 2013, issued in U.S. Appl. No. 12/786,230.
US Office Action dated Feb. 15, 2013, U.S. Appl. No. 13/274,638.
Partial European Search Report mailed Apr. 17, 2013, issued in Application No. 12181659.9.
Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.
Woody K. Chung, "Downstream Plasma Removal of Mobile Ion Impurity From SI02", Published Proceedings of the 8$^{th}$ International Plasma Processing Symposium, Fall 1990, 7 pages.
Woody K, Chung, "Low Damage, Downstream RF Plasma Ashing of High Energy, Heavily Doped Implanted Resists," Semicon Korea, Dec. 1989.
A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.
Goto et al , "Enhanced Stripping of Low-K Films Using Downstream Gas Mixing," Novellus Systems, Inc., U.S. Appl. No. 10/890,653, filed Jul. 13, 2004.
U.S. Office Action for U.S. Appl. No. 10/890,653 mailed Jul. 27, 2005.
U.S. Final Office Action for U.S. Appl. No. 10/890,653 mailed Jan. 10, 2006.
U.S. Office Action for U.S. Appl. No. 10/890,653 mailed Jun. 26, 2006.
U.S. Office Action for U.S. Appl. No. 10/890,653 mailed Oct. 11, 2006.
U.S. Office Action for U.S. Appl. No. 10/890,653 mailed Apr. 5, 2007.
Notice of Allowance for U.S. Appl. No. 10/890,653 mailed Jun. 15, 2007.
Allowed Claims for U.S. Appl. No. 10/890,653.
Supplemental Notice of Allowance for U.S. Appl. No. 10/890,653 mailed Jul. 23, 2007.
Goto et al , "Enhanced Stripping of Low-K Films Using Downstream Gas Mixing," Novellus Systems, Inc., U.S. Appl. No. 11/011,273, filed Dec. 13, 2004.
Notice of Allowance for U.S. Appl. No. 11/011,273 mailed Nov. 28, 2006.
Allowed Claims for U.S. Appl. No. 11/011,273.
Goto et al , "Enhanced Stripping of Low-K Films Using Downstream Gas Mixing," Novellus Systems, Inc., U.S. Appl. No. 11/712,253, filed Feb. 27, 2007, pp. 1-28.
U.S. Office Action for U.S. Appl. No. 11/712,253 mailed Dec. 23, 2008.

(56) References Cited

OTHER PUBLICATIONS

Goto, et al., "Photoresist Strip Method for Low-K Dielectrics," U.S. Appln. No. 11/859,727, filed Sep. 21, 2007.
U.S. Office Action for U.S. Appl. No. 11/859,727 mailed Oct. 6, 2008.
Notice of Allowance for U.S. Appl. No. 11/859,727 mailed May 1, 2009.
Allowed Claims for U.S. Appl. No. 11/859,727.
Goto, et al., "High Dose Implantation Strip (HDIS) in H2 Base Chemistry," Novellus Systems, Inc., U.S. Appl. No. 12/251,305, filed Oct. 14, 2008.
Goto, et al., "Photoresist Strip Method for Low-K Dielectrics," U.S. Appl. No. 12/533,461, filed Jul. 31, 2009.
U.S. Office Action for U.S. Appl. No. 11/712,253 mailed Jul. 17, 2009.
Chen, et al., "Method for Post-Etch Cleans," U.S. Appl. No. 10/137,096, May 1, 2002.
U.S. Office Action for U.S. Appl. No. 10/137,096 mailed Jul. 11, 2003.
U.S. Final Office Action for U.S. Appl. No. 10/137,096 mailed Jul. 27, 2007.
Notice of Allowance for U.S. Appl. No. 10/137,096 mailed Jan. 15, 2008.
Allowed Claims for U.S. Appl. No. 10/137,096.
Chen, et al., "Method for Post-Etch Cleans," U.S. Appl. No. 12/111,095, filed Aug. 28, 2008.
U.S. Office Action for U.S. Appl. No. 12/111,095 mailed Aug. 25, 2008.
Notice of Allowance for U.S. Appl. No. 12/111,095 mailed Apr. 3, 2009.
Allowed Claims for U.S. Appl. No. No. 12/111,095.
Chen, et al., "Method for Post-Etch Cleans," U.S. Appl. No. 12/502,130, filed Jul. 31, 2009.
U.S. Office Action for U.S. Appl. No. 11/712,253 mailed Jan. 29, 2010.
Notice of Allowance for U.S. Appl. No. 11/548,801 mailed Feb. 17, 2010.
Cheung, et al., "Plasma Based Photoresist Removal System for Cleaning Post Ash Residue," U.S. Appl. No. 11/128,930, filed May 12, 2005.
U.S. Office Action for U.S. Appl. No. 11/128,930 mailed Sep. 13, 2006.
U.S. Final Office Action for U.S. Appl. No. 11/128,930 mailed Mar. 8, 2007.
U.S. Office Action for U.S. Appl. No. 11/128,930 mailed Mar. 19, 2007.
U.S. Office Action for U.S. Appl. No. 11/128,930 mailed Jun. 29, 2007.
U.S. Office Action for U.S. Appl. No. 11/128,930 mailed Dec. 10, 2007.
U.S. Final Office Action for U.S. Appl. No. 11/128,930 mailed Jul. 21, 2008.
U.S. Office Action for U.S. Appl. No. 11/128,930 mailed Mar. 20, 2009.
U.S. Office Action for U.S. Appl. No. 11/128,930 mailed Sep. 17, 2009.
U.S. Office Action for U.S. Appl. No. 11/128,930 mailed Feb. 26, 2010.
U.S. Final Office Action for U.S. Appl. No. 11/128,930 mailed Sep. 9, 2010.
S. Wolf and R.N. Tauber, (Silicon Processing for the VLSI Era, vol. 1—Process Technology, Lattice Press, 1986), pp. 539-543.
U.S. Office Action for U.S. Appl. No. 12/533,461 mailed Nov. 5, 2010.
U.S. Office Action for U.S. Appl. No. 12/502,130 mailed Dec. 8, 2010.
Cheung, et al. "Ultra Low Silicon Loss High Dose Implant Strip," U.S. Appl. No. 12/636,582, filed Dec. 11, 2009.
Cheung, et al. "Low Damage Photoresist Strip Method for Low-K Dielectrics," U.S. Appl. No. 12/636,601, filed Dec. 11, 2009.
Cheung, et al. "Enhanced Passivation Process to Protect Silicon Prior to High Dose Implant Strip," U.S. Appl. No. 12/963,503, filed Dec. 8, 2009.
U.S. Office Action for U.S. Appl. No. 11/712,253 mailed Mar. 1, 2011
U.S. Office Action for U.S. Appl. No. 11/128,930 mailed May 10, 2011.
U.S. Final Office Action for U.S. Appl. No. 12/533,461 mailed May 26, 2011.
International Search Report and Written Opinion for Application No. PCT/US2010/059388 mailed Jun. 27, 2011.
International Search Report and Written Opinion for Application No. PCT/US2010/059547 mailed Jul. 13, 2011.
International Search Report and Written Opinion for Application No. PCT/US2010/059517 mailed Jul. 14, 2011.
Notice of Allowance for U.S. Appl. No. 12/533,461 mailed Aug. 12, 2011.
Allowed Claims as of Aug. 12, 2011 for U.S. Appl. No. 12/533,461.
Oct. 13, 2011 Notice of Allowance for U.S. Appl. No. 12/502,130 mailed Aug. 12, 2011.
Allowed Claims as of Aug. 12, 2011 for U.S. Appl. No. 12/502,130.
Singapore Written Opinion dated Jul. 15, 2013, issued in Application No. 201204092-9.

\* cited by examiner

LOW DAMAGE PHOTORESIST STRIP METHOD FOR LOW-K DIELECTRICS

BACKGROUND

The present invention pertains to methods for stripping photo-resist material and removing etch-related residues from the surface of a partially fabricated integrated circuit in preparation for further processing.

Damascene processing techniques are often preferred methods in many modern integrated circuit manufacturing schemes because it requires fewer processing steps and offers a higher yield than other methods. Damascene processing involves forming metal conductors on integrated circuits by forming inlaid metal lines in trenches and vias in a dielectric layer (inter-metal dielectric). As part of the Damascene process, a layer of photoresist is deposited on a dielectric layer. The photoresist is a light-sensitive organic polymer which can be "spun on" in liquid form and dries to a solid thin film. The photosensitive photoresist is then patterned using light through the mask and wet solvent. A plasma etching process (dry etch) is then used to etch exposed portions of dielectric and transfer the pattern into the dielectric, forming vias and trenches in the dielectric layer.

Once the dielectric layer is etched, the photoresist must be stripped and any etch-related residues must be thoroughly removed before subsequent processing to avoid embedding impurities in the device. Conventional processes for stripping photoresist employ a plasma formed from a mixture of gases with the presence of oxygen in the plasma. The highly reactive oxygen based plasma reacts with and oxidizes the organic photoresist to form volatile components that are carried away from the wafer surface.

Highly oxidizing conditions are also generally unsuitable for use on low dielectric constant (low-k) materials. Low-k materials have been used as inter-metal and/or inter-layer dielectrics between conductive interconnects in many modern devices to reduce the delay in signal propagation due to capacitive effects. The lower the dielectric constant of the dielectric material, the lower the capacitance of the dielectric and the lower the RC delay of the integrated circuit. Typically, low-k dielectrics are silicon-oxide based materials with some amount of incorporated carbon, commonly referred to as carbon doped oxide (CDO). It is believed, although not necessarily proven, that the oxygen scavenges or removes carbon from the low-k materials. In many of these materials such as CDOs, the presence of carbon is instrumental in providing a low dielectric constant. Hence, to the extent that the oxygen removes carbon from these materials, it effectively increases the dielectric constant. As processes used to fabricate integrated circuits moves toward smaller and smaller dimensions and requires the use of dielectric materials having lower and lower dielectric constants, it has been found that the conventional strip plasma conditions are not suitable.

What is needed therefore are improved and more efficient methods for stripping photoresist and etch-related materials from dielectric materials, especially from low-k dielectric materials.

SUMMARY OF THE INVENTION

The present invention addresses the aforementioned need by providing improved methods for stripping photoresist and removing etch-related residues from dielectric materials. In one aspect of the invention, methods involve removing material from a dielectric layer using a hydrogen-based etch process employing a weak oxidizing agent and fluorine-containing compound. Substrate temperature is maintained at a level of about 160° C. or less, e.g., less than about 90° C.

In certain embodiment, the methods involve introducing gas comprising a weak oxidizing agent, fluorine-containing compound and hydrogen into the reaction chamber, and applying RF power to form a plasma within the reaction chamber to convert at least a portion of the material to gaseous form, thereby removing at least a portion of the material from the partially fabricated integrated circuit. As stated previously, methods may be used to remove photoresist and/or residues from the etch process. Methods may be effectively implemented on Damascene devices, including single and dual Damascene devices.

According to various embodiments, the weak oxidizing agent comprises at least one of carbon dioxide, carbon monoxide, nitrous oxide, nitric oxide and nitrogen dioxide and water. In a particular embodiment, the weak oxidizing agent comprises carbon dioxide. In certain embodiments, the gas comprises between about 0.1% to about 10.0% carbon dioxide by volume. In some embodiments, the gas further comprises at least one inert carrier gas such as helium, argon or nitrogen. In certain embodiments, the gas does not comprise molecular oxygen.

According to various embodiments, the fluorine-containing compound comprises at least one of nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro [2-]butane ($C_4F_8$), octofluoroisobutylene ($C_4F_8$), fluorine ($F_2$), and the like. In a particular embodiment, the weak oxidizing agent comprises nitrogen trifluoride. In certain embodiments, the gas comprises between about 5 ppm to about 10% nitrogen trifluoride by volume.

Methods of the invention may be implemented on any size wafer. Most modern wafer fabrication facilities use either 200 mm or 300 mm wafers. Process conditions may vary depending upon the wafer size. If a 300 mm wafer is used, the total flow rate of gas may range between about 1,000 sccm and about 40,000 sccm. If carbon dioxide is used as the weak oxidizing agent, the flow rate of carbon dioxide may range between about 10 sccm and about 2000 sccm, e.g., 800 sccm. If nitrogen trifluoride is used as the fluorine-containing gas, the flow rate of nitrogen trifluoride may range between about 1 and 20 sccm, e.g., 5 sccm. Typically, the RF plasma power for a 300 mm wafer ranges between about 300 Watts to about 3 Kilowatts for a plasma. Methods may be implemented using a direct or remote plasma.

During the application of plasmas to the work piece surface, substrate temperatures can range between about 50° C. degrees and about 160° C. In certain embodiments, work piece temperatures are maintained at about 90° C. or less. Example chamber pressures can range between about 300 mTorr and about 2 Torr. In some embodiments, the wafer is held at a bias.

As mentioned previously, methods of the invention may be used with low-k dielectric materials, including carbon-doped low-k dielectric materials such as carbon-doped oxides (CDOs). Methods of the invention can be implemented on both non-porous and porous dielectric materials, including CDOs and other compositions.

Methods of the invention may be implemented in any suitable reaction chamber. The reaction chamber may be one chamber of a multi-chambered apparatus or it may be part of a single chamber apparatus. In some embodiments, a multi-stage removal process is used, with the fluoride-containing compound used only a subset of the stages. In certain embodiments, the fluoride-containing compound is used only in a first set of stages, e.g., a first stage. In embodiments wherein a multi-station apparatus is used, the fluoride-containing compound may be used as part of process gas used to generate a plasma in the first station, for example.

These and other features and advantages of the present invention will be described in more detail below with reference to the associated drawings.

DETAILED DESCRIPTION OF THE PREFERRED EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

As mentioned previously, methods of the invention may be used to efficiently and effectively to remove photoresist and etch-related materials from a low-k dielectric materials. Methods of the invention are not limited to low-k dielectrics. Methods are also not limited to any particular category of low-k dielectrics. For instance, described methods may be effectively used on dielectrics with k values less than 4.0, dielectrics with k values less than about 2.8 and dielectrics with k values less than about 2.0 ("ultra-low-k" or ULK dielectrics). The low-k dielectric may be porous or non-porous (sometimes referred to as a "dense" low-k dielectric). Generally, low-k dense dielectrics are those having k values no greater than 2.8 and low-k porous dielectrics are those having k values no greater than 2.2. Low-k dielectrics of any suitable composition may be used, including silicon oxide based dielectrics doped with fluorine and/or carbon. Non-silicon oxide based dielectrics, such as polymeric materials, may also be used. Any suitable process may be used to deposit the low-k dielectric, including as spin-on deposit and CVD deposit techniques. In the case of forming porous dielectrics, any suitable method may be used. A typical method involves co-depositing a silicon-based backbone and an organic porogen and subsequently removing the porogen component, leaving a porous dielectric film. Other methods include sol-gel techniques. Specific examples of suitable low-k films are carbon based spin-on type films such as SILK™ and CVD deposited porous films such as Coral™.

Methods of the invention use plasmas that are produced from gases that contain hydrogen and a weak oxidizing agent, and in certain processing operations, a fluorine-containing compound. One skilled in the art will recognize that the actual species present in the plasma may be a mixture of different ions and molecules derived from the hydrogen, weak oxidizing agent and/or fluorine-containing compound. It is noted that other species may be present in the reaction chamber, such as small hydrocarbons, carbon dioxide, water vapor and other volatile components as the plasma reacts with and breaks down the organic photoresist and other residues. One of skill in the art will also recognize that reference to the initial gas/gases introduced into the plasma is/are different from other gas/gases that may exist after the plasma is formed.

Process

Figure 1:
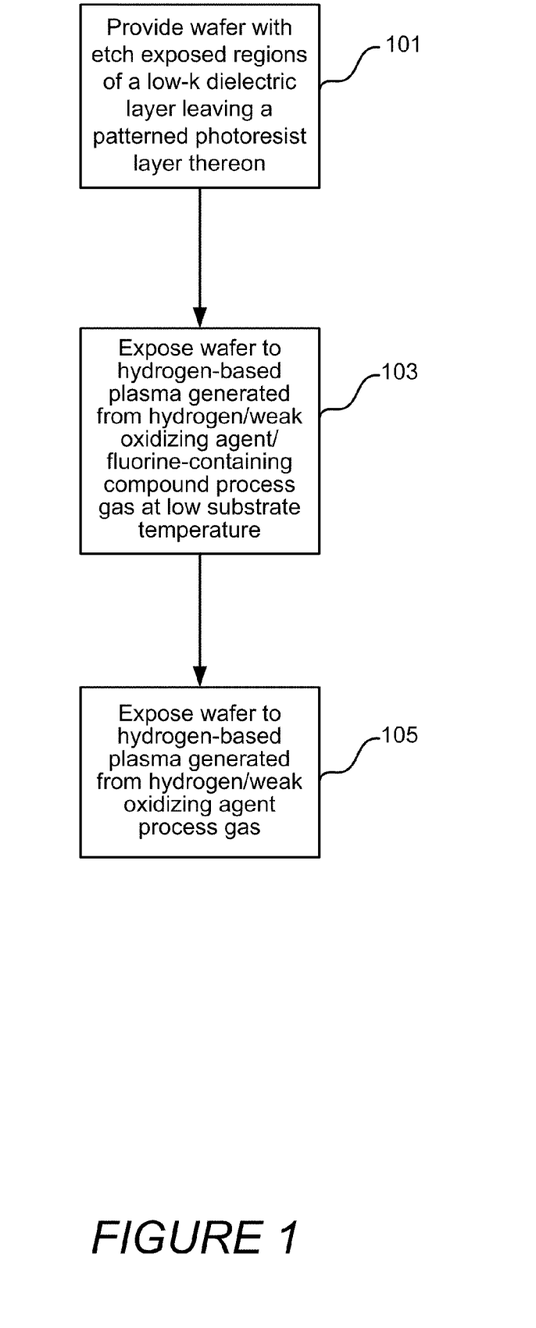
FIG. 1 is a process flow diagram illustrating aspects of some embodiments of the invention employed for stripping photoresist and removing etch-related residue from a partially fabricated integrated circuit.

FIG. 1 is a flow chart depicting one general high-level process flow in accordance with some embodiments of the present invention. Note that some typical operations related to the methods of the invention involved in integrated circuit (IC) fabrication are also included in FIG. 1 to provide a context for how the invention may be used. To provide a visual context of some embodiments of the invention, FIGS. 2A through 2C show cross-sectional depictions of a portion of a low-k Damascene device during various pertinent fabrication processes.

Referring to FIG. 1, a wafer with exposed regions of a low-k dielectric layer are etched leaving a patterned photoresist layer thereon is provided (block 101). FIGS. 2A and 2B depict the forming of a patterned low-k dielectric in the context of processing a Damascene device 200. FIG. 2A shows device 200 before and FIG. 2B shows device 200 after a dry etch process. FIG. 2B corresponds to the state of the device provided in block 101 of FIG. 1.

Figure 2A:
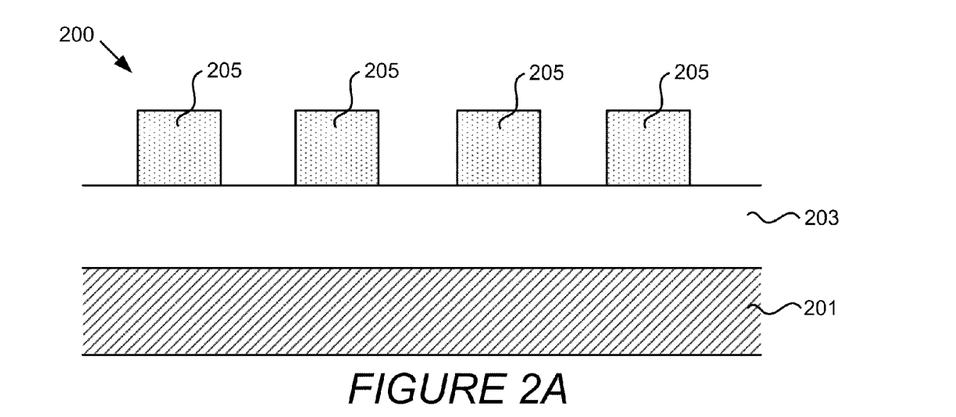
FIGS. 2A-2C show cross sectional depictions of a low-k Damascene device during dry etch and photoresist strip processes in accordance with the invention.

Referring to FIG. 2A, layer 201 has a low-k dielectric layer 203 deposited thereon, which has portions of photoresist 205 deposited thereon. Depending on the particular integration scheme, underlying layer 201 may be a metal layer such as copper, an etch stop layer such as silicon carbide or silicon nitride, or another type of layer. Photoresist 205 was previously patterned using UV light lithography (or other suitable process) to leave exposed portions of low-k dielectric layer 203. Device 200 is then subjected to a dry etch process, typically one of sputter etching, plasma etching or reactive ion etching.

Figure 2B:
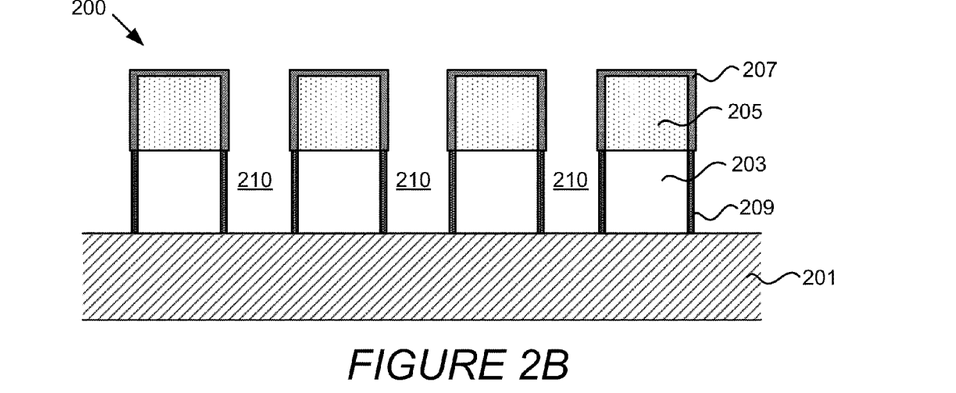
Figure 2C:
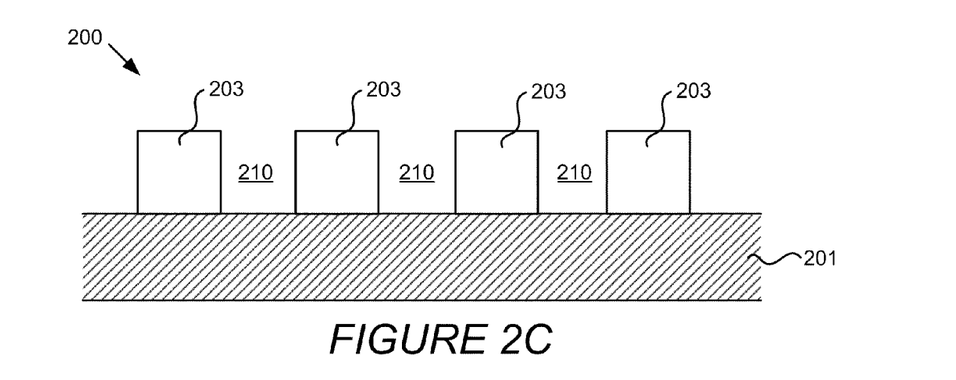

As shown in FIG. 2B, after the dry etch process, the resulting device 200 has features 210 etched within an ultra low-k dielectric layer 203. Photoresist portions 205 must be stripped before further wafer processing. Note that the tops and sides of the exposed photoresist portions 205 have "skins" 207 that are relatively hard portions of the photoresist as a result of some dry etch processes and that can be compositionally different from the bulk photoresist portions 205. The skin is typically composed of dielectric residues re-deposited from low-k dielectric 203 and re-deposited polymer residue from the photoresist 205. In addition to the skin, a film 209 can also form over exposed sidewalls of low dielectric 203. This film typically is made of polymer residues and damaged portions of the low-k dielectric from ion bombardment during the dry etch process.

Referring back to FIG. 1, the photoresist is stripped of a first portion of the photoresist (block 103). In certain embodiments, this first portion includes skin that was formed from the etch process and is generally tougher to remove. In this operation the wafer is exposed to a hydrogen-based plasma with a weak oxidizing agent and a fluorine-containing compound. For example, in certain embodiments, the wafer is exposed to a H2/CO2/NF3 plasma. As discussed further below, a relatively small amount of fluorine-containing compound is employed in this operation. In one example, H2 flow rate is about 20,000 sccm (20 slpm), CO2 flow rate 800 sccm (0.8 slpm) and NF3 flow rate 5 sccm. The individual flow rates may vary depending on the particular embodiment. The H2 flow rate is two orders of magnitude larger than that of the CO2 flow rate, and four orders of magnitude larger than the NF3 flow. In certain embodiments, the CO2 flow rate is at least one order of magnitude larger than the NF3 flow. These ranges may be applied to other weak oxidizing agents and fluorine-containing compounds as appropriate.

This operation is typically performed in a different reaction chamber from the chamber where the etch took place. Such a reaction chamber may be referred to as a stand-alone "strip unit." Any apparatus with a suitable plasma reaction chamber can be used. The system may provide a direct (in situ plasma) or remote plasma.

It should be noted that the operation 103 may be used in certain embodiments to replace a conventional oxygen-based strip that is performed in the same reaction chamber in which the etch took place and typically involves exposure to an oxygen-based plasma. This oxidizing partial strip operation can damage some low-k dielectric materials, and may not be performed in certain implementations. Thus in certain embodiments, the wafer is provided in operation 101 without having previously undergone such a strip process in the etch chamber.

Referring again to FIG. 1, the next operation is to expose the wafer to a hydrogen-based plasma with a weak oxidizing agent to strip the bulk photoresist and/or remove etch-related material (block 105). In certain embodiments, fluorine is not present in this operation, unlike in the previous operation. In certain embodiments, the bulk of the photoresist and residue is removed in this operation, which may itself include multiple sub-operations.

The total flow rate of gas, the relative amount of weak oxidizing agent and fluorine-containing compound and other conditions in the strip chamber can vary depending upon, among other factors, plasma type (downstream versus direct), RF power, chamber pressure, substrate (wafer) size and type of weak oxidizing agent used. In some examples using the Novellus Gamma™ system (downstream plasma system), the plasma may comprise between about 0.1% to 10% carbon dioxide by volume and between about 5 ppm to 10% nitrogen trifluoride (if present) by volume.

In addition to hydrogen, weak oxidizing agent, and fluorine-containing gas, a carrier gas such as helium, argon or nitrogen may be used. The carrier gas is typically an unreactive gas. For shipment and handling safety reasons, commercial hydrogen is available in mixtures with noble gases such as helium. These commercially available gas mixtures may be used for the methods of this invention.

After the majority of the photoresist and etch residue has been removed during plasma strip in operation 105, one or more additional plasma strip or wet clean operations may be performed. It should also be noted that in multi-station apparatuses, operations 103 and 105 may each be performed over one or more than one station.

The wafer is typically temperature controlled during exposure to the plasma. In particular, the temperature such that it is no more than about 200° C., no more than about 160° C., no more than about 150° C., no more than about 140° C., no more than about 130° C., no more than about 120° C., no more than about 110° C., no more than about 100° C., no more than about 90° C., no more than about 80° C., or no more than about 60° C. In particular embodiments, the substrate is maintained at temperature no more than about 90° C. It has been found that these relatively low temperatures are critical in certain embodiments to preventing significant damage to the ULK film.

Figure 3A:
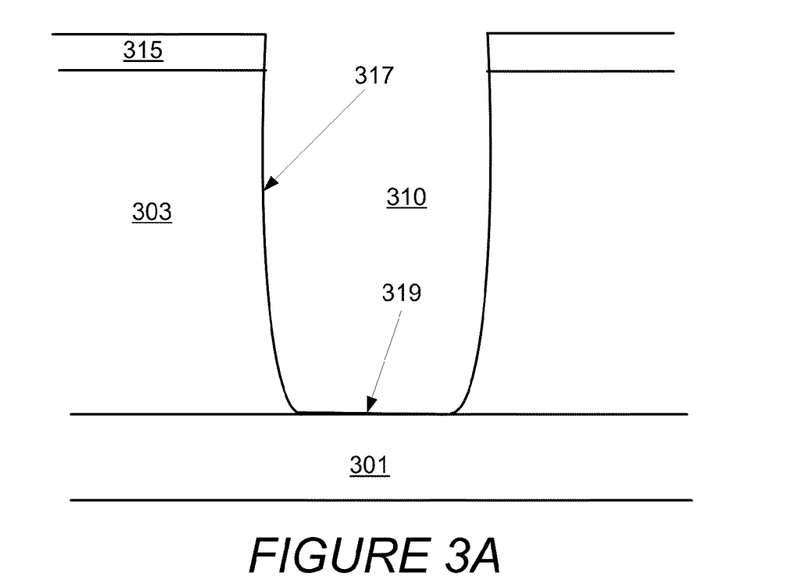
FIGS. 3A and 3B show cross sectional depictions of a low-k device during dry after photoresist strip and HF-test processes in accordance with the invention.
Figure 3B:
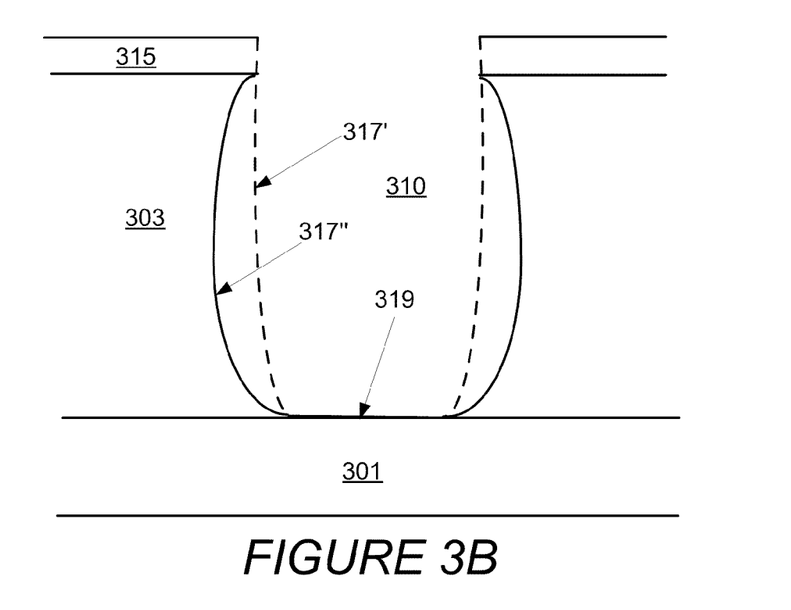

FIG. 3A depicts a patterned ultra low-k dielectric layer 303, hard mask layer 315, and silicon carbide layer 301, after photoresist removal as described above. Etched into low-k dielectric layer 303 is recessed feature 310, which may be a via or trench. The feature 310 includes sidewalls 317 and bottom 319. It has been found that if the photoresist removal occurs at too high of a temperature, the low-k material near the sidewalls 317 is damaged. One manner in which this damage is tested is by an HF dip, for example a 100:1 dilution of HF for 45 seconds. In one example, a photoresist removal process as described above in was performed at 90° C. and compared to a process using the same chemistry, but performed at 280° C. FIG. 3B depicts the results with 317" showing the profile of the feature stripped at 280° C., and 317' showing the profile of the feature stripped at 90° C. While the profile 317' was found to be substantially unchanged from the as-stripped feature profile, profile 317" is bowed inward. The region between these two profiles is the area that is damaged under the high temperature stripping process. The higher temperature process may also remove a certain amount of etch stop material from the bottom of the feature.

Higher temperatures allow a faster etch rate; however, it has been found that more fluorine is required to etch as the temperature is increased. As a result, damage to the dielectric is increased. Damage can also occur, however, by long exposure times that come from using low temperatures. However, it has been found that temperatures in the ranges described above can prevent or reduce damage within the constraints of these competing effects.

In one example, the following process conditions were used to produce a low damage strip:
  Station 1: 20 slpm H2/0.8 slpm CO2/5 sccm NF3
  Station 2-5: 20 slpm H2/0.8 slpm CO2
  Stations 1-5: 0.9 Torr/90° C./3.5 kW RF plasma/103 seconds per station In certain embodiments, the temperature is raised for one or more operations after exposure to the fluorine-containing plasma. For example, a temperature of less than 160° C. or less than 90° C. may be used during exposure to the fluorine-based plasma, and raised prior to or during exposure to the one or more operations that use fluorine-free plasmas. Temperature may be raised in stages in certain embodiments, with later stations using higher temperatures than earlier ones. The higher temperature may be within the range described, or may be higher than that described. For example, in certain embodiments, later stations can use higher temperatures such as 285° C. However, in many embodiments, temperature is maintained at a low temperature throughout the strip process.

The above description provides examples of removing photoresist using low temperature hydrogen-based plasmas, in particular processes that involve exposing photoresist and etch-related residues to a plasma generated from hydrogen gas, wherein the wafer temperature is maintained at a low temperature, e.g., less than about 200° C., less than about 160° C., less than about 150° C., less than about 140° C., less than about 130° C., less than about 120° C., less than about 110° C., less than about 100° C., less than about 90° C., less than about 80° C., or less than about 60° C. In certain embodiments, the gas used to generate the plasma consists essentially of hydrogen gas in one or more operations. In alternate embodiments, one or more of a weak oxidizing agent, a fluorine-containing gas and a carrier gas may be added to the hydrogen gas in one or more operations, as described above. Examples of process gas chemistries that may be employed to generate a plasma for the low-temperature exposure operations include H2; H2/CO2; H2/CO2/NF3 and H2/NF3, with other weak oxidizing agents and fluorine-containing agents described above substituted for or added to CO2 and NF3, respectively. Depending on the characteristics of the photoresist and etch residue present, these may be used at any or all of the removal operations depicted in FIGS. 2A-2C.

For example, to remove the "skin," the gas used to generate the hydrogen-based plasma may have essentially no CO2 or other weak oxidizing agent present. Also, in certain embodiments, there may essentially no NF3 or other fluorine-containing gas present. The gas used to generate the hydrogen-based plasma to remove the bulk photoresist may have essentially no CO2 or other weak oxidizing agent present. In many embodiments, there may essentially no NF3 or other fluorine-containing gas present, as described above. However, NF3 or other fluorine-containing gas may be present in certain embodiments.

Apparatus

As mentioned, any suitable plasma reaction chamber apparatus may be used. Suitable plasma chambers and systems include the Gamma 2100, 2130 $I^2CP$ (Interlaced Inductively Coupled Plasma), G400, and GxT offered by Novellus Systems, Inc. of San Jose, Calif. Other systems include the Fusion line from Axcelis Technologies Inc. of Rockville, Md., TERA21 from PSK Tech Inc. in Korea, and the Aspen from Mattson Technology Inc. in Fremont, Calif. Additionally, various strip chambers may be configured onto cluster tools. For example, a strip chamber may be added to a Centura cluster tool available from Applied Materials of Santa Clara, Calif.

Figure 4A:
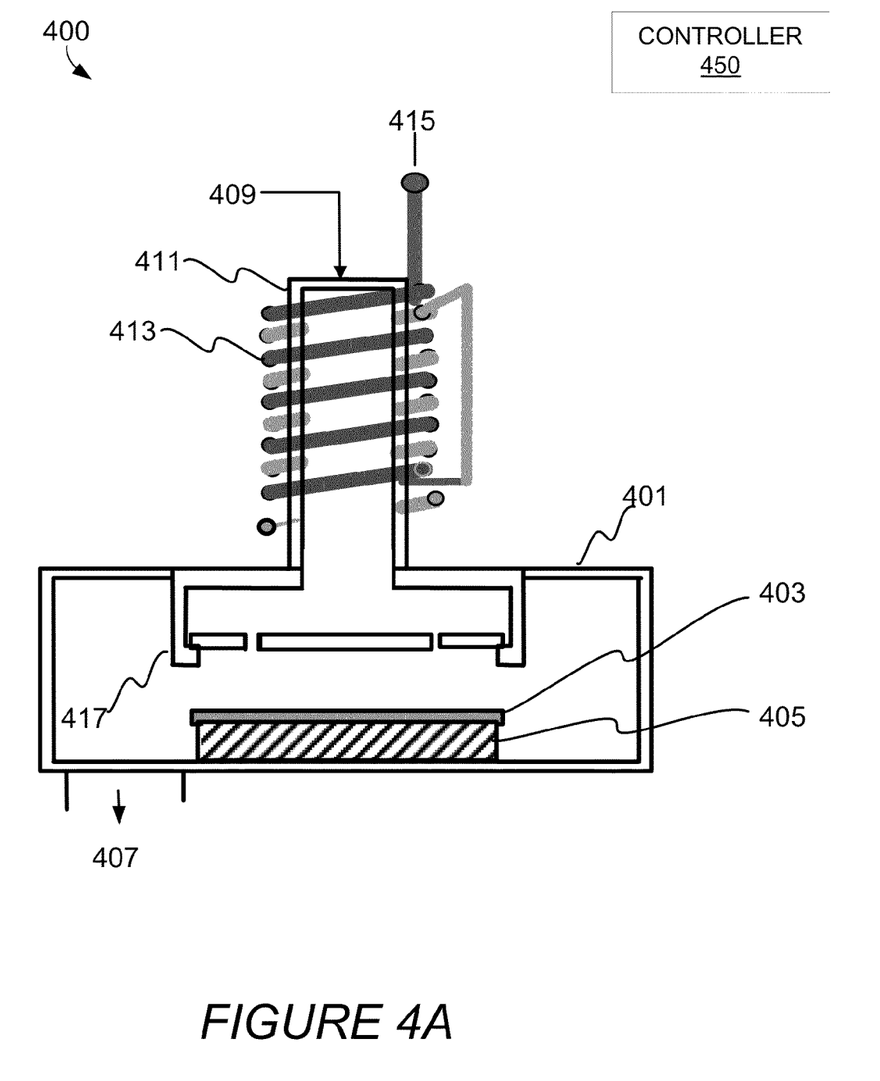
FIG. 4A is a schematic illustration showing an apparatus suitable for practicing the present invention.

FIG. 4A is a schematic illustration showing aspects of a downstream plasma apparatus 400 suitable for practicing the present invention on wafers. Apparatus 400 has a plasma source 411 and an exposure chamber 401 separated by a showerhead assembly 417. Inside exposure chamber 401, a wafer 403 rests on a platen (or stage) 405. Platen 405 is fitted with a heating/cooling element. In some embodiments, platen 405 is also configured for applying a bias to wafer 403. Low pressure is attained in exposure chamber 401 via vacuum pump via conduit 407. Sources of gaseous hydrogen (with or without dilution/carrier gas), carbon dioxide (or other weak oxidizing agent), and if present nitrogen trifluoride (or other fluorine-containing gas) provide a flow of gas via inlet 409 into plasma source 411 of the apparatus. Plasma source 411 is surrounded in part by induction coils 413, which are in turn connected to a power source 415. During operation, gas mixtures are introduced into plasma source 411, induction coils 413 are energized and a plasma is generated in plasma source 411. Showerhead assembly 417, which has an applied voltage, terminates the flow of some ions and allows the flow of neutral species into exposure chamber 401. As mentioned, wafer 403 may be temperature controlled and/or a RF bias may be applied. Various configurations and geometries of the plasma source 411 and induction coils 413 may be used. For example, induction coils 413 may loop around the plasma source 411 in an interlaced pattern. In another example, the plasma source 411 may be shaped as a dome instead of a cylinder. A controller 450 may be connected to components of the process chamber, and control process gas composition, pressure, temperature and wafer indexing of the stripping operations. Machine-readable media may be coupled to the controller and contain instructions for controlling process conditions for these operations.

Figure 4B:
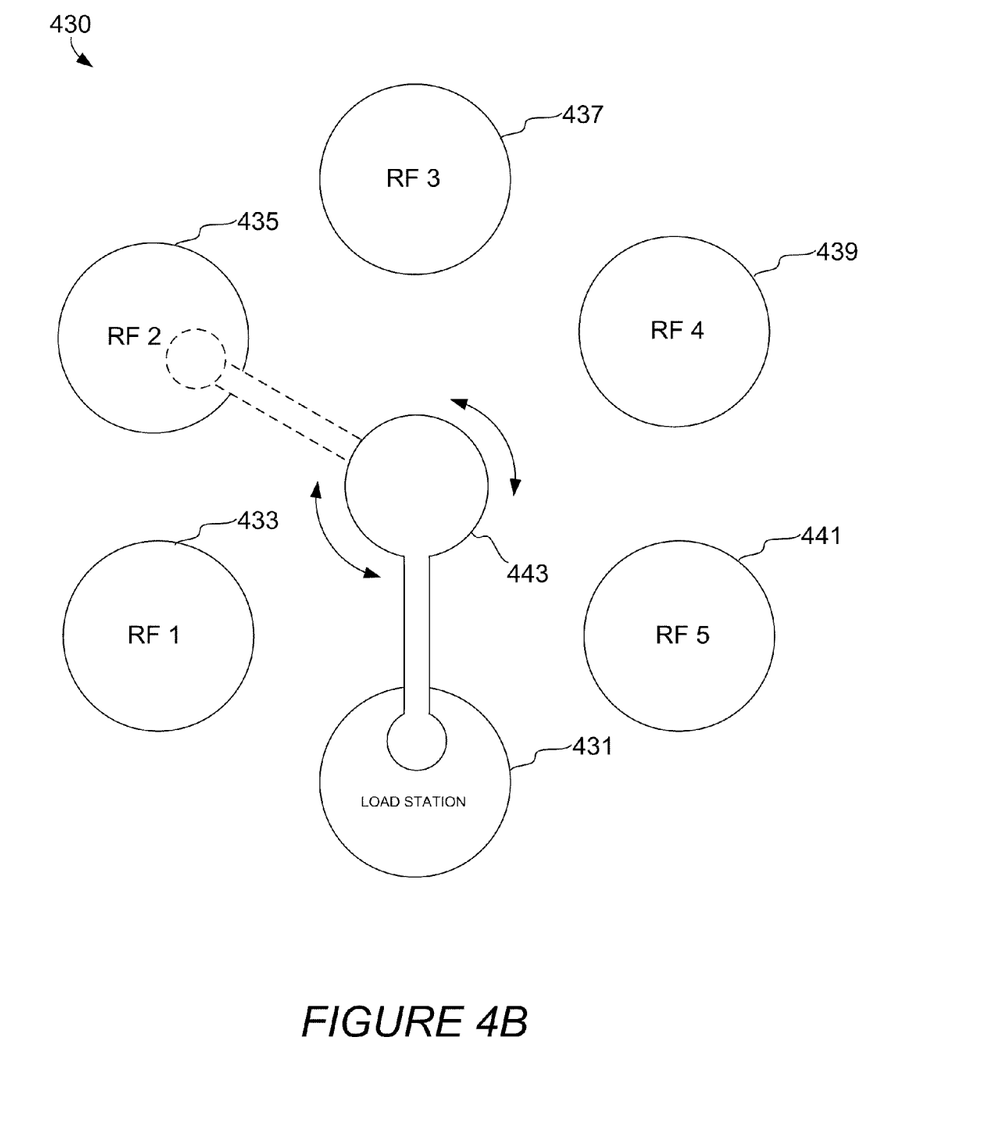
FIG. 4B is a simple block diagram showing a multi-station stripping tool suitable for practicing the present invention.

As mentioned, in some embodiments, the apparatus of the invention is a strip unit dedicated to stripping photoresist from wafers. Generally, such a strip unit tool will have multiple wafer process stations so that multiple wafers may be processes simultaneously. FIG. 4B is a simple block diagram showing a top-down view of a multi-station wafer strip unit tool 430 that may be used in accordance with the invention. Strip unit tool 430 has five strip stations 433, 435, 437, 439 and 441 and one load station 431. Strip unit tool 430 is configured such that each station is capable of processing one wafer and so all stations may be exposed to a common vacuum. Each of strip stations 433, 435, 437, 439 and 441 has its own RF power supply. Load station 431 is typically configured with a load-lock station attached thereto to allow the input of wafers into strip unit tool 430 without a break in vacuum. Load station 431 may also be configured with a heat lamp to pre-heat wafers before transferring to strip stations and photoresist stripping. Strip station 441 is typically configured with a load-lock station attached thereto to allow the output of wafers from strip unit tool 430 without a break in vacuum. A robotic arm 443 transfers wafers from station to station.

During typical manufacturing mode, wafers are processed in batch mode. Batch mode processing can increase wafer though-put and is therefore commonly used in manufacturing operation. In batch mode, each wafer is transferred to, and processed in, each of stations 431, 433, 435, 437, 439 and 441. For example, a typical batch mode process will proceed as follows: A wafer is first loaded into load station 431 where it is preheated with a heat lamp. Next, robotic arm 443 transfers the wafer to strip station 433 where it is plasma processed using a fluorine-based plasma for a time period sufficient to strip off about ⅕ of the photoresist. Robotic arm 443 then transfers the wafer to strip station 435 where it is plasma processed using a non-fluorine process for a time period sufficient to strip off about another ⅕ of the remaining photoresist. This sequence is continued such that the wafer is processed at strip stations 437, 439 and 441. At strip station 441, the photoresist should be largely removed and the wafer is then unloaded from the strip unit tool.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of removing photoresist material from a dielectric layer on a work piece as part of a partially fabricated integrated circuit after an etch process, the method comprising:

forming a first plasma from a gas comprising hydrogen and a fluorine-containing compound; exposing the work piece to the first plasma;

forming a second plasma from a gas comprising hydrogen, wherein the second plasma is generated from a fluorine-free process gas chemistry; and exposing the work piece to the second plasma, wherein the work piece temperature is maintained at a temperature below about 100° C. and at least some of the photoresist material is removed from the dielectric layer by the first and second plasma exposures.

2. The method of claim 1, wherein the work piece temperature is maintained at a temperature below about 90° C.

3. The method of claim 1, wherein the gas from which the first plasma is formed further comprises an oxidizing agent selected from the group consisting of carbon dioxide, carbon monoxide, nitrous oxide, nitric oxide and nitrogen dioxide and water.

4. The method of claim 1, wherein the fluorine-containing compound is comprises at least one of nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), and fluorine ($F_2$).

5. The method of claim 1, wherein the fluorine-containing compound is nitrogen trifluoride.

6. The method of claim 1 wherein the work piece has not undergone a previous oxygen-based plasma photoresist stripping operation.

7. The method of claim 1, wherein the photoresist material being removed from the dielectric layer comprises residues from the etch process.

8. The method of claim 3, wherein the oxidizing agent is carbon dioxide.

9. A method of removing photoresist from a dielectric layer on a work piece as part of a partially fabricated integrated circuit after an etch process, the method comprising:

forming a first plasma from a gas comprising hydrogen, a weak oxidizing agent and a fluorine-containing compound, the weak oxidizing agent selected from the group consisting of carbon dioxide, carbon monoxide, nitrous oxide, nitric oxide and nitrogen dioxide and water; exposing the work piece to the first plasma to thereby remove photoresist from the dielectric layer, forming a second plasma from a fluorine-free process gas chemistry, and exposing the work piece to the second plasma to thereby remove photoresist from the dielectric layer, wherein the work piece temperature is maintained at a temperature below about 100° C. during the exposure to the first plasma.

10. The method of claim 9 wherein work piece temperature is maintained at a temperature below about 90° C. during the exposure to the first plasma.

11. The method of claim 9, wherein the process gas chemistry used to form the second plasma comprises hydrogen and a weak oxidizing agent selected from the group consisting of carbon dioxide, carbon monoxide, nitrous oxide, nitric oxide and nitrogen dioxide and water.

12. The method of claim 9 wherein work piece temperature is maintained at a temperature below about 160° C. during the exposure to the second plasma.

13. The method of claim 9 wherein work piece temperature is maintained at a temperature below about 90° C. during the exposure to the second plasma.

14. The method of claim 9 wherein the work piece temperature is higher during exposure to the second plasma than during exposure to the first plasma.

15. The method of claim 9 wherein the volume percentage of the fluorine-containing compound in the gas is no more than 1%.

* * * * *